US012681649B2

(12) United States Patent
Gao

(10) Patent No.:  US 12,681,649 B2
(45) Date of Patent:       Jul. 14, 2026

(54) SYSTEM WITH MCU AND FLASH MEMORY AND CONTROL METHOD FOR DEEP POWER DOWN CONTROL THEREOF

(71) Applicant: GIGADEVICE SEMICONDUCTOR INC., Beijing (CN)

(72) Inventor: Yang Gao, Beijing (CN)

(73) Assignee: GIGADEVICE SEMICONDUCTOR INC., Beijing (CN)

( * ) Notice: Subject to any disclaimer, the term of this patent is extended or adjusted under 35 U.S.C. 154(b) by 120 days.

(21) Appl. No.: 18/209,638

(22) Filed: Jun. 14, 2023

(65) Prior Publication Data

US 2024/0201877 A1      Jun. 20, 2024

(30) Foreign Application Priority Data

Dec. 19, 2022   (CN) .......................... 202211631988.2

(51) Int. Cl.
*G06F 3/06*            (2006.01)
*G06F 1/32*            (2019.01)
*G11C 16/30*          (2006.01)

(52) U.S. Cl.
CPC .......... *G06F 3/0625* (2013.01); *G06F 3/0634* (2013.01); *G06F 3/0658* (2013.01); *G06F 3/0679* (2013.01); *G11C 16/30* (2013.01)

(58) Field of Classification Search
CPC ..... G06F 3/0625; G06F 1/3287; G06F 1/3275
See application file for complete search history.

(56) References Cited

U.S. PATENT DOCUMENTS

| | | | | |
|---|---|---|---|---|
| 5,428,579 A | * | 6/1995 | Robinson ............ | G06F 12/0684 |
| | | | | 711/E12.089 |
| 5,603,036 A | * | 2/1997 | Wells ..................... | G06F 1/3275 |
| | | | | 713/322 |
| 10,802,736 B2 | * | 10/2020 | Shin ........................ | G11C 5/147 |
| 11,029,716 B1 | * | 6/2021 | Chan ..................... | H02M 3/073 |
| 11,307,632 B2 | * | 4/2022 | Karthikeyan ............. | G06F 1/14 |
| 2002/0166065 A1 | * | 11/2002 | Cheung ............... | G06F 12/1433 |
| | | | | 711/E12.1 |
| 2003/0025689 A1 | * | 2/2003 | Kim ....................... | G06F 1/3203 |
| | | | | 345/211 |
| 2005/0068799 A1 | * | 3/2005 | Bedwell ................... | G11C 5/14 |
| | | | | 365/189.12 |
| 2018/0150252 A1 | * | 5/2018 | Lewis ................... | G06F 3/0634 |
| 2018/0203643 A1 | * | 7/2018 | Pedersen ............... | G11C 5/148 |
| 2019/0034106 A1 | * | 1/2019 | Shin ....................... | G06F 3/0679 |
| 2019/0079575 A1 | * | 3/2019 | Hanson ................ | G06F 1/3243 |
| 2019/0187922 A1 | * | 6/2019 | Marley ................. | G06F 3/0622 |
| 2019/0286219 A1 | * | 9/2019 | Anazawa ................ | G06F 3/068 |
| 2020/0279611 A1 | * | 9/2020 | Reusswig ................ | G11C 7/20 |
| 2021/0311540 A1 | * | 10/2021 | Wong ........................ | G06F 1/28 |

(Continued)

*Primary Examiner* — Jaweed A Abbaszadeh
*Assistant Examiner* — Cheri L Harrington
(74) *Attorney, Agent, or Firm* — Ziegler IP Law Group, LLC.

(57)       ABSTRACT

The present invention provides a system with an MCU and flash memory and a method for DPD control thereof. A new DPD mode (first DPD mode) is provided by simply adding a power supply pin to the MCU. The power supply pin is coupled to a power supply terminal of the flash memory. In a deep power down mode, the flash memory is configured to be entirely powered down, leading to even lower system power consumption than in a conventional DPD mode (second DPD mode).

20 Claims, 8 Drawing Sheets

(56) References Cited

U.S. PATENT DOCUMENTS

| | | | |
|---|---|---|---|
| 2021/0375332 A1* | 12/2021 | Akamatsu | G06F 3/0679 |
| 2022/0200584 A1* | 6/2022 | Pirozzi | G05F 1/46 |
| 2022/0254418 A1* | 8/2022 | Lin | G06F 3/0688 |
| 2023/0131586 A1* | 4/2023 | Pedersen | G06F 1/3296 |
| | | | 713/320 |
| 2024/0047986 A1* | 2/2024 | Vankunavath | H02J 7/0068 |
| 2024/0200980 A1* | 6/2024 | Poli | G01D 3/036 |

* cited by examiner

SYSTEM WITH MCU AND FLASH MEMORY AND CONTROL METHOD FOR DEEP POWER DOWN CONTROL THEREOF

CROSS-REFERENCE TO RELATED APPLICATION

This application claims the priority of Chinese patent application number 202211631988.2, filed on Dec. 19, 2022 and entitled "SYSTEM WITH MCU AND FLASH MEMORY AND CONTROL METHOD FOR DEEP POWER DOWN CONTROL THEREOF," the entire contents of which are incorporated herein by reference.

TECHNICAL FIELD

The present invention relates to the field of integrated circuit design technology and, in particular, to a system with a microcontroller unit (MCU) and flash memory and a method for deep power down (DPD) control thereof.

BACKGROUND

Flash memory is a type of memory with electrical erasability, programmability and fast data access, and does not lose the data stored upon loss of power. Currently, many microcontroller units (MCU) adopt the MCU+FLASH system architecture with built-in or externally attached flash memory, which allows fast storage in the flash memory of various data for the MCU, such as firmware programs and other sensitive data. The flash memory is typically connected to the MCU via a communication bus interface compatible with, for example, the serial peripheral interface (SPI) or other protocols. Through such an SPI communication bus interface, the MCU can deliver the instructions supported by the flash memory, thus accomplishing control of read, write and erase operations, and its operating modes. In order to switch the entire system to a deep sleep mode, the MCU may send a deep power down (DPD) mode instruction to the flash memory through the SPI communication bus interface. In response to this DPD mode instruction, the flash memory may enter its own DPD mode in correspondence with the entry of the system DPD mode.

However, in the existing MCU+FLASH system architecture, even in the system deep sleep mode, a part of the circuits in the flash memory remains in operation, leading to some static and dynamic power consumption. Thus, the system's power consumption is not minimized, making it unsuitable for use in applications requiring lower power consumption.

SUMMARY OF THE INVENTION

It is an object of the present invention to provide a system with an MCU and a flash memory wherein the flash memory stores therein codes and/or sensitive data for the MCU and comprises a first circuit portion and a second circuit portion, and wherein the MCU comprises at least one power supply pin coupled to a power supply terminal of the flash memory, wherein, in a normal mode, the MCU utilizes a power supply control signal to enable power to be supplied to the power supply terminal of the flash memory, thereby allowing a normal operation of each of the first and second circuit portions; and in a first DPD mode, the MCU utilizes the power supply control signal to cut off power to the power supply terminal of the flash memory, thereby powering down each of the first and second circuit portions.

BRIEF DESCRIPTION OF THE DRAWINGS

Those of ordinary skill in the art will appreciate that the following drawings are presented merely to provide a better understanding of the present invention rather than to limit the scope thereof. In the drawings.

DETAILED DESCRIPTION

Figure 1:
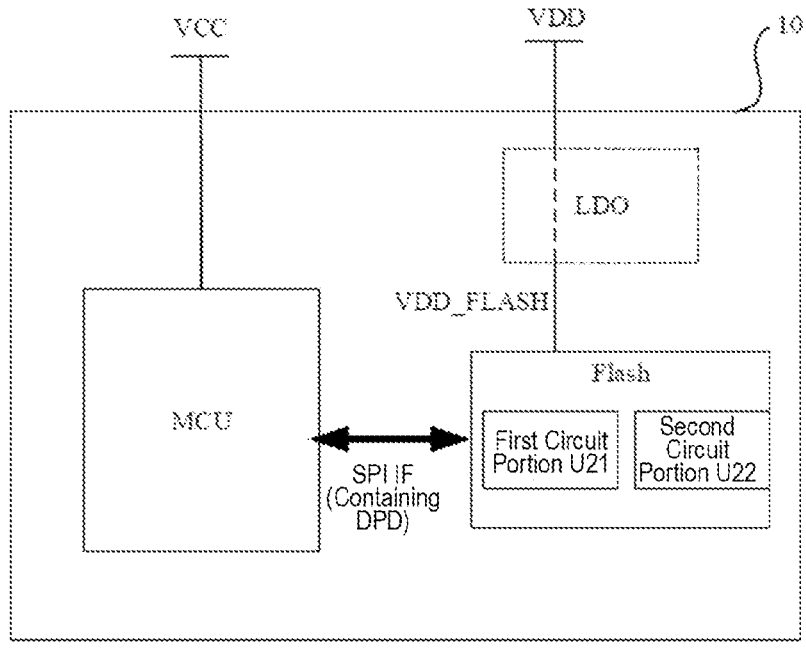
FIG. 1 schematically illustrates the architecture of an existing system-in-package (SIP) MCU system with an MCU and flash memory.

The following description sets forth numerous specific details in order to provide a more thorough understanding of the present invention. However, it will be apparent to those skilled in the art that the present invention can be practiced without one or more of these specific details. In other instances, well-known technical features have not been described in order to avoid unnecessarily obscuring of the invention. It is to be understood that the invention may be embodied in many different forms and should not be construed as being limited to the embodiments set forth below. Rather, these embodiments are provided so that this disclosure illustrates the scope of the invention to those skilled in the art. In the drawings, the same reference numerals refer to the same elements throughout. It will be understood that when an element is referred to as being "connected to" or "coupled to" another element, it can be directly connected or coupled to the other element, or intervening elements may also be present. In contrast, when an element is referred to as being "directly connected to" another element, there are no intervening elements. As used herein, the singular forms "a", "an" and "the" are intended to include the plural forms as well, unless the context clearly indicates otherwise. It will be further understood that the term "comprising" specifies the presence of stated features, steps, operations, elements, and/or components, but do not preclude the presence or addition of one or more other features, steps, operations, elements, components, and/or groups thereof. As used herein, the term "and/or" includes any and all combinations of the associated listed items.

FIG. 1 shows a common, existing MCU+FLASH system architecture, which is a system-in-package (SIP) MCU system architecture. Specifically, a system-in-package process is employed to integrate an MCU die and a flash memory die within a single package 10 so that the flash memory is externally attached to the MCU. This architecture can simplify the manufacturing process, shorten the design circle and enable the use of an advanced 2.5D/3D/wafer-level packaging technique to further integrate other dies of various functions (e.g., the linear and low-dropout (LDO) regulator in FIG. 1) within the same package 10. Therefore, it enables the system to meet high requirements in terms of performance, power consumption, density, etc.

Usually, a power supply terminal of the flash memory is wired via the LDO regulator to a power supply VDD on a PCB (not shown) loading the package 10. The flash memory typically stores therein firmware codes (or firmware programs) and other sensitive data for the MCU and provides a deep power down (DPD) mode of its own operating in accordance with entry and exit of the SIP MCU system's DPD mode. The flash memory is typically connected to the MCU by a communication bus interface for, for example, the SPI or another protocol (not shown; while the following description is set forth in the context of the SPI protocol as an example, it is not intended to limit the scope of the present invention in any way). Through this SPI communication bus interface, the MCU can deliver the instructions (denoted as "SPI IF" in the figure) supported by the flash memory, thus accomplishing control of read, write and erase operations on data in the flash memory, and control of the operating modes of the flash memory (i.e., a normal mode or a deep power down mode).

In order to switch the SIP MCU system architecture to a deep sleep mode, the MCU may send a DPD instruction to the flash memory through the SPI communication bus interface. In response to this instruction, the flash memory may enter its own DPD mode a certain time later, and the MCU may also power down its own relevant internal circuits, bringing the entire SIP MCU system architecture into the DPD mode.

However, this SIP MCU system architecture has some disadvantages. After the SIP MCU system architecture enters the deep sleep mode, the flash memory is in its own DPD mode, however, in this mode, the power supply VDD is still supplying power to the power supply terminal of the flash memory, and only a part (the second circuit portion U22) of circuits of the flash memory is powered down, with the rest (the first circuit portion U21) is still in operation. The first circuit portion U21 usually contains a circuit required by the flash memory to switch from the DPD mode back to its normal mode. Consequently, there remains some static and dynamic power consumption of the flash memory, which limits the further reduction in power consumption of the system.

In addition, the flash memory must take some time to enter its own DPD mode after responding to the DPD instruction from the MCU, extending the overall time required by the SIP MCU system architecture to enter the DPD mode.

In view of the above, the present invention provides a system with an MCU and flash memory having an additional power supply pin or pad on the MCU, as compared to the prior art. The power supply pin is coupled to a power supply terminal (VDD_FLASH) of the flash memory, and in order to switch the system to a deep sleep mode, a power supply control signal can be provided to cut power to the power supply terminal of the flash memory to totally power down internal circuitry of the flash memory, thus avoiding any static or dynamic power consumption remaining in the flash memory and enabling the system to consume even less power in the deep sleep mode. Additionally, cutting power to the power supply terminal of the flash memory can shorten the overall time required by the system to enter the deep sleep mode.

The present invention will be described in greater detail below with reference to the accompanying drawings and to specific embodiments. Advantages and features of the invention will become more apparent from the following description. Note that the figures are provided in a very simplified form not necessarily drawn to exact scale and for the purpose of facilitating easy and clear description of the disclosed embodiments only.

Embodiment 1

Figure 2A:
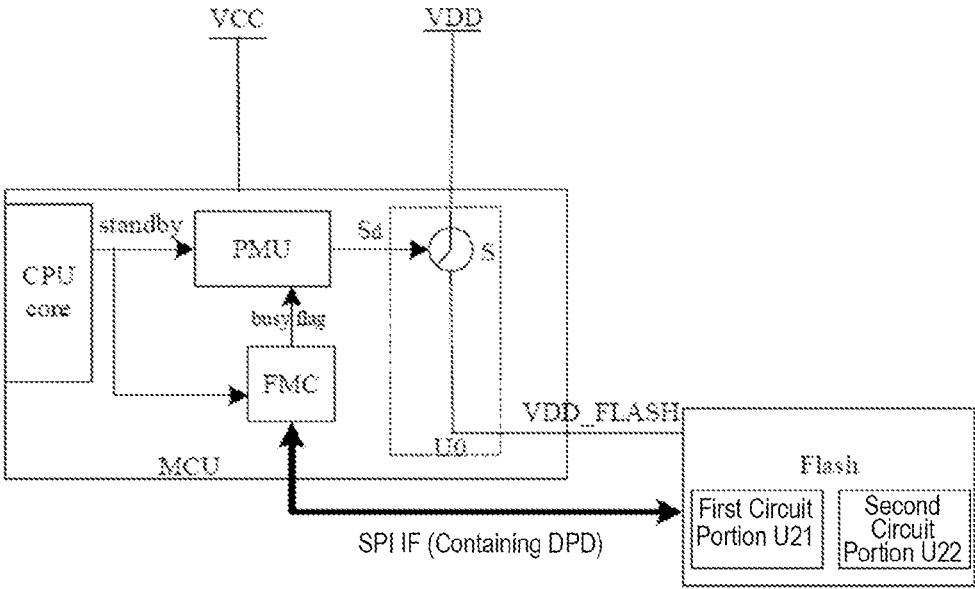
FIGS. 2A and 2B schematically illustrate various exemplary architectures of a system with an MCU and flash memory according to a first embodiment of the present invention.
Figure 2B:
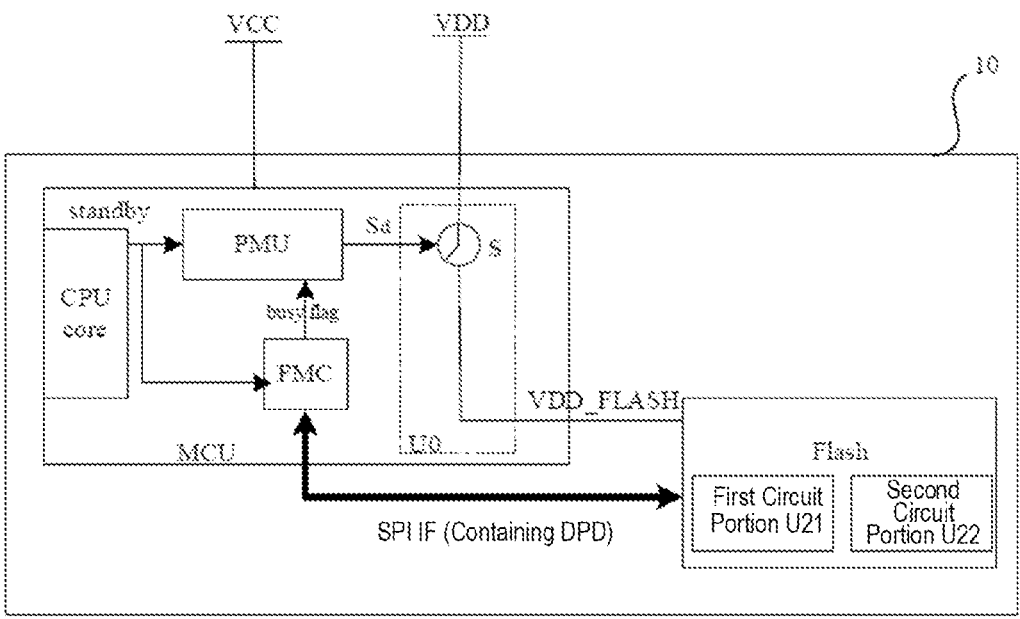

Referring to FIGS. 2A and 2B, in Embodiment 1 of the present invention, a system with an MCU and flash memory is provided. In addition to the MCU and the flash memory, the system further includes a power supply switching module U0.

The flash memory includes a first circuit portion U21 and a second circuit portion U22. The first circuit portion U21 may include some wake-up circuits, an internal clock circuit and the like, and the second circuit portion U22 may include a memory array, an address decoder and the like. Firmware programs and/or other sensitive data for the MCU are stored in the second circuit portion U22.

At least one power supply pin (not labeled) is provided on the MCU and coupled to a power supply terminal VDD_FLASH of the flash memory. Preferably, the power supply switching module U0 is arranged within the MCU and includes an analog switch circuit S. An input terminal (not shown) of the analog switch circuit S is coupled to a power supply VDD, and an output terminal of the analog switch circuit S is coupled to the power supply pin of the MCU that is coupled to the power supply terminal VDD_FLASH of the flash memory. Thus, the output terminal is coupled to the power supply terminal VDD_FLASH of the flash memory. A control terminal (not shown) of the analog switch circuit S is coupled to a power supply control signal Sd of the MCU.

As an example, with reference to FIG. 2A, the MCU and the flash memory may be implemented as two chips welded to a single printed circuit board (PCB).

As another example, with reference to FIG. 2B, the MCU and the flash memory may be implemented as two dies integrated in a single package 10 using a system-in-package (SIP) technique. The MCU and flash memory dies may be juxtaposed in the package 10. Alternatively, they may be three-dimensionally stacked using an advanced 2.5D/3D/wafer-level packaging technique.

It would be appreciated that, in practice, the output terminal of the analog switch circuit S in Embodiment 1 may be directly packaged as the added power supply pin of the MCU chip in Embodiment 1 as compared to the existing MCU chip.

Additionally, the analog switch circuit S may be implemented as any suitable circuit design with controllable switching, such as a relay switch, a CMOS switch, a bootstrapped switch, a logic gate circuit, or the like. Moreover, the MCU may incorporate any suitable electronic devices and circuit structures. For example, it may include: an analog-to-digital converter (ADC) (not shown) and associated circuits in an analog domain (not shown); registers (not shown), a CPU core, a power management unit (PMU), a flash memory controller (FMC) and circuits in a digital domain; and so forth. The circuits in the analog domain and digital domain belongs to different power domain of MCU. For example, the various circuits powered with a specific power supply VCCA (not shown) are in the analog domain, while the circuits powered with a specific voltage Vcore (not shown, Vcore is, for example, a voltage converted from the power supply VCC as shown in various figures of this invention) are in the digital domain. The CPU core may be the most important component of the MCU that handles almost all tasks in the MCU, including computation, reception/storage of instructions, data processing, etc. Associated L1 and L2 caches, execution units, instruction-level units and other units may be provided in the CPU core. In order to switch the system to a deep sleep mode, the CPU core may receive a deep sleep instruction (which may be triggered by hardware or software in the MCU) and issue, based on the deep sleep instruction, a DPD mode signal Standby to the PMU and the FMC. The FMC may be communicatively connected to the flash memory by a communication bus interface (not shown) for, for example, the serial peripheral interface (SPI) or another protocol and may send through the communication bus interface instructions SPI IF for control of read, write and erase operations on the flash memory, as well as for control of operating modes. Upon receipt of the DPD mode signal Standby, the FMC may check the status of the flash memory. For ease of description, the following description is set forth in the context of the "communication bus interface" being implemented as an "SPI communication bus interface" as an example.

In the system of Embodiment 1, in a normal mode, under the control of the power supply control signal Sd of the MCU, electrical power is supplied to the power supply terminal VDD_FLASH of the flash memory. Specifically, under the control of the power supply control signal Sd of the MCU, the PMU in the MCU may turn on (or switch on or close) the analog switch circuit S, enabling the power supply VDD to supply power to the power supply terminal VDD_FLASH of the flash memory through the turned-on analog switch circuit S. As a result, the power supply terminal VDD_FLASH of the flash memory is powered, enabling normal operation of both the first circuit portion U21 and the second circuit portion U22 in the flash memory. In a first DPD mode, under the control of the power supply control signal Sd, power to the power supply terminal VDD_FLASH of the flash memory is cut off by the MCU, thus powering down both the first circuit portion U21 and the second circuit portion U22 in the flash memory. Specifically, under the control of the power supply control signal Sd, the PMU in the MCU may turn off (or switch off or open) the analog switch circuit S, making the power supply VDD impossible to supply power to the power supply terminal VDD_FLASH of the flash memory. As a result, power to the power supply terminal VDD_FLASH of the flash memory is cut off, and the first circuit portion U21 and the second circuit portion U22 in the flash memory are both powered down.

Figure 3A:
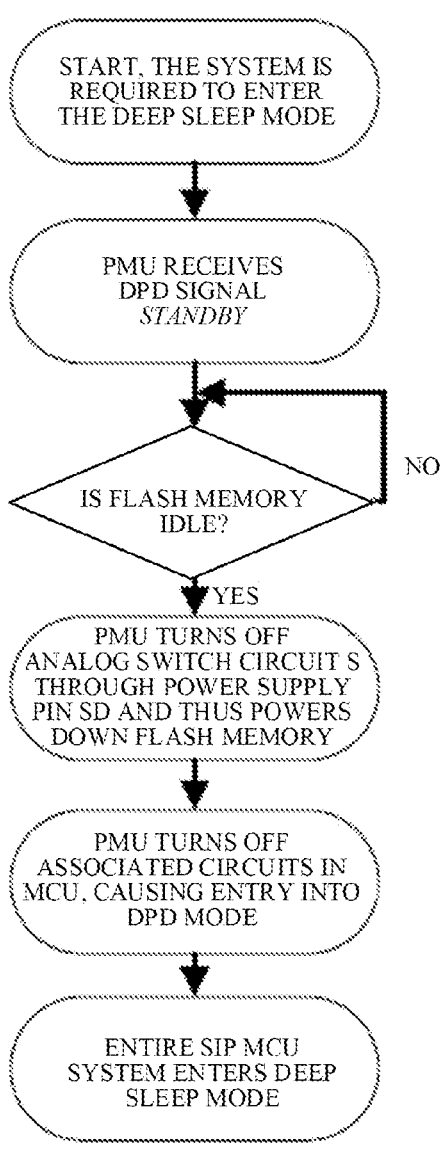
FIG. 3A shows an exemplary flowchart of a method for deep power down (DPD) control of the system according to the first embodiment of the present invention.

Accordingly, referring to FIGS. 2A and 3A, an exemplary method for DPD control of the system in Embodiment 1 may include the following steps.

First of all, when the system is required to enter the deep sleep mode, the CPU core (not shown) in the MCU, which is independent of the PMU and the FMC but also in the MCU, receives a deep sleep instruction (which may be triggered by hardware or software in the MCU) and issues, based on the deep sleep instruction, a DPD mode signal Standby to the PMU and the FMC. Both the PMU and the FMC in the MCU receive the DPD mode signal Standby.

The FMC then checks, via the SPI communication bus interface, whether the flash memory is idle, i.e., whether the MCU is performing a read, write, erase or other operation on the flash memory, and notifies the PMU of the result. For example, after checking whether the flash memory is idle, the FMC may pull down a status flag signal Busy Flag therein and deliver it to the PMU.

If the flash memory is currently idle, then the PMU activates the power supply control signal Sd (e.g., by pulling it to a high level) and turns off the analog switch circuit S, cutting off power to the power supply terminal VDD_FLASH of the flash memory. As a result, the first circuit portion U21 and the second circuit portion U22 in the flash memory are both powered down, and the flash memory enters the first DPD mode. If the flash memory is currently busy, then the PMU waits for completion of the operation on the flash memory, and activates the power supply control signal Sd (e.g., by pulling it to a high level) once the FMC detects that the flash memory becomes idle, thereby turning off the analog switch circuit S.

After cutting off power to the power supply terminal VDD_FLASH of the flash memory, the PMU further cuts off power to associated circuits (e.g., circuits in a digital domain and analog domain) in the MCU, bringing the entire system into the deep sleep mode.

Compared with the prior art, this exemplary method enables the system to consume less power.

It would be appreciated that the DPD mode signal Standby output from the CPU core may be a pulse. In this case, when entry of the system into the deep sleep mode is required, the CPU core may produce a pulse representing the DPD mode signal Standby from the deep sleep instruction and provides the pulse to the PMU and the FMC. In the normal mode of the system, the CPU core will not generate such a pulse.

As another example, in the system with the MCU and flash of Embodiment 1, a DPD mode control bit (not shown) may be configured in the MCU, optionally in a configuration register in the PMU. In this case, in response to receipt of the DPD mode signal, the PMU may choose whether to activate the power supply control signal Sd and hence whether to cut power to the power supply terminal VDD_FLASH of the flash memory and thereby whether to bring the flash memory into the first DPD mode or a second DPD mode, further based on whether the DPD mode control bit configured in the configuration register is "1" (indicating the DPD mode control bit is set) or "0" (indicating the DPD mode control bit is not set). In this way, the DPD mode signal Standby determines, in combination with the DPD mode control bit, which of the normal mode, the first DPD mode and the second DPD mode the system is to operate in. Specifically, in absence of the DPD mode signal Standby, the system operates in the normal mode, in which the PMU eliminates or deactivates the power supply control signal Sd (e.g., by pulling it down to a low level) output to the analog switch circuit S, thus turning on the analog switch circuit S and maintaining power supplied to the power supply terminal VDD_FLASH of the flash memory. Upon receiving the DPD mode signal Standby, if the DPD mode control bit is "1" (i.e., if the DPD mode control bit is set), the PMU activates the power supply control signal Sd (e.g., by pulling it up to a high level) output to the analog switch circuit S to turn off the analog switch circuit S, thereby cutting power to the power supply terminal VDD_FLASH of the flash memory and bringing the system into the first DPD mode. If the DPD mode control bit is "0" (i.e., if the DPD mode control bit is unset), even when the DPD mode signal Standby is received, the PMU will eliminate or deactivate the power supply control signal Sd (e.g., by pulling it down to a low level) output to the analog switch circuit S. As a result, the analog switch circuit S remains turned-on, and power remains supplied to the power supply terminal VDD_FLASH of the flash memory, bringing the system into the second DPD mode, in which the first circuit portion U21 of the flash memory remains in normal operation, while the second circuit portion U22 is powered down. In this mode, the system consumes more power than in the first DPD mode. However, since the first circuit portion U21 is still operating, the system can exit the DPD mode within a shorter time.

Figure 3B:
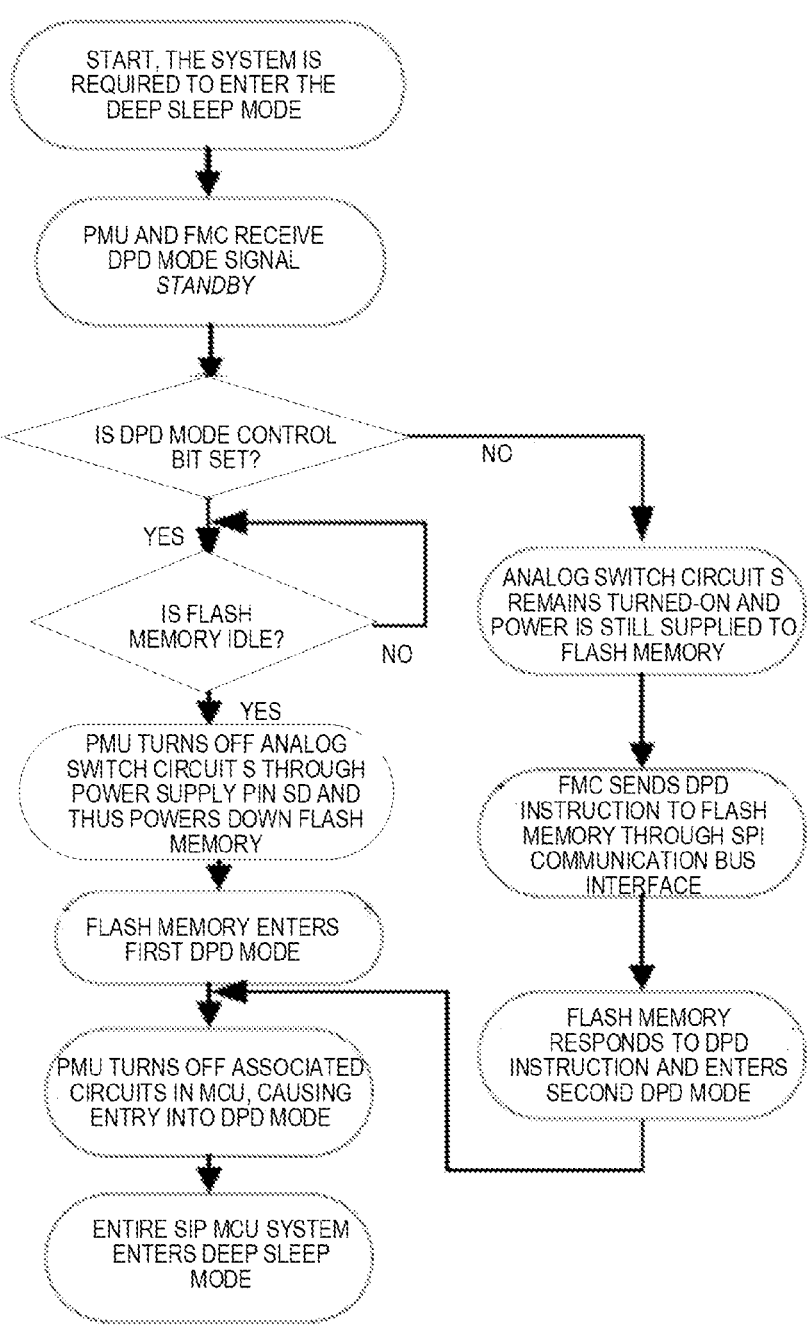
FIG. 3B shows an exemplary flowchart of another method for DPD control of the system according to the first embodiment of the present invention.

Accordingly, referring to FIGS. 2A and 3B, another exemplary method for DPD control of the system with the MCU and flash in Embodiment 1 may include the following steps.

First of all, in response to a need for entry of the system into the deep sleep mode, the CPU core (not shown) in the MCU receives a deep sleep instruction and generates therefrom a DPD mode signal Standby, which is then received by both the PMU and the FMC in the MCU.

The FMC then checks, via the SPI communication bus interface, whether the flash memory is idle, i.e., whether the MCU is performing a read, write, erase or other operation on the flash memory, and notifies the PMU of the result. For example, after checking whether the flash memory is idle, the FMC may pull down a status flag signal Busy Flag therein and deliver it to the PMU.

Moreover, after receiving the DPD mode signal Standby, the PMU checks whether the DPD mode control bit is set. If the DPD mode control bit is set and the flash memory is currently idle, the PMU activates the power supply control signal Sd (e.g., by pulling it up to a high level), thus switching off the analog switch circuit S. As a result, power to the power supply terminal VDD_FLASH of the flash memory is cut off, powering down the first circuit portion U21 and the second circuit portion U22 in the flash memory and bringing the flash memory into the first DPD mode. If the DPD mode control bit is set and the flash memory is currently busy, the PMU waits for completion of the operation on the flash memory and activates the power supply control signal Sd until the FMC detects that the flash memory becomes idle. In this way, the analog switch circuit S is turned off and power to the power supply terminal VDD_FLASH of the flash memory is cut off after the flash memory becomes idle.

If the DPD mode control bit is unset, then regardless of whether the flash memory is currently busy or idle, the PMU eliminates or deactivates the power supply control signal Sd output to the analog switch circuit S (e.g., by pulling it down to a low level). As a result, the analog switch circuit S remains turned-on, and power remains supplied to the power supply terminal VDD_FLASH of the flash memory. A DPD mode instruction is then delivered to the flash memory from the FMC through the SPI communication bus interface, and the flash memory responsively enters the second DPD mode a certain time later.

When the flash memory enters the first or second DPD mode, the PMU further powers down associated circuits in the MCU (e.g., circuits in a digital domain and analog domain), thus bringing the entire system into the deep sleep mode.

It would be appreciated that, in the various foregoing examples, before the system is switched to the deep sleep mode, whether there is an ongoing operation on the flash memory is taken into account. This is advantageous in, for example, preventing a crash, which is detrimental to the service life of the system. However, the present invention is not limited to these examples. In other examples of the Embodiment 1, in order to enable the system to enter the deep sleep mode as quickly as possible, it may be not necessary to consider whether there is an ongoing operation on the flash memory. For example, the system may be forced to enter the deep sleep mode. In this case, the PMU may activate the power supply control signal Sd (e.g., by pulling it up to a high level) simply based on the received DPD mode signal Standby, or on both the DPD mode signal Standby and the configuration information of the DPD mode control bit, without considering the result of the checking from the FMC. As a result, the analog switch circuit S can also be turned off to cut off power to the power supply terminal VDD_FLASH of the flash memory. Moreover, after power to the power supply terminal VDD_FLASH of the flash memory is cut off, associated circuits in the MCU (e.g., circuits in a digital domain and analog domain) may be additionally powered down. In this way, the system can be brought into the deep sleep mode as fast as possible.

It would be also appreciated that, when the system is operating in the normal mode, the analog switch circuit S is turned off, allowing power to be supplied to the power supply terminal VDD_FLASH of the flash memory to support normal operation of the first circuit portion U21 and the second circuit portion U22 in the flash memory. For example, in the normal mode, read, write and erase instructions may be issued by the FMC in the MCU to the flash memory through the SPI communication bus interface for control of read, write, erase and other operation on data in the flash memory. Further, although the communication bus interface between the MCU and the flash memory has been described in the above examples as supporting the SPI protocol, the present invention is not so limited, as it may alternatively support any other suitable communication protocol, as long as the FMC is allowed to transmit read, write and erase instructions and operating mode control instructions to the flash memory through the communication bus interface for accomplishing control of read, write, erase operations on data in the flash memory, as well as for control of the operating modes.

As can be seen from the above, compared with the existing system architecture, the system and methods in Embodiment 1 provide a new DPD mode (i.e., the first DPD mode) by simply adding only one power supply pin to the MCU, which is coupled to the power supply terminal of the flash memory. When it is required to switch the system to the deep sleep mode, the flash memory can be entirely powered down, leading to lower system power consumption than that in the conventional deep sleep mode (i.e., the second DPD mode). Moreover, when the flash memory is idle, faster entry into the deep sleep mode is made possible. Further, since the system and methods are compatible with the conventional deep sleep mode, they are suitable for use in both regular and special low power consumption applications.

Embodiment 2

With some products, it is not suitable to directly provide the power supply voltage VDD to the flash memory. Accordingly, with reference to FIGS. 4A and 4B, in Embodiment 2 of the present invention, a system with an MCU and flash memory is provided, which differs from the system of Embodiment 1 in including a power supply switching module U0 including a voltage conversion circuit LDO. An input terminal of the voltage conversion circuit LDO is coupled to an output terminal of an analog switch circuit S, and an output terminal of the voltage conversion circuit LDO is coupled to a power supply pin of the MCU that is coupled to a power supply terminal VDD_FLASH of the flash memory. Thus, the output terminal of the voltage conversion circuit LDO is coupled to the power supply terminal VDD_FLASH of the flash memory. The voltage conversion circuit LDO is able to convert the power supply voltage VDD to a power supply voltage suitable to be provided at the power supply terminal VDD_FLASH of the flash memory.

The voltage conversion circuit LDO may be implemented by any suitable circuit design, such as a linear and low-dropout (LDO) regulator, a constant-voltage source, a switched-mode power supply (SMPS), etc.

Figure 4A:
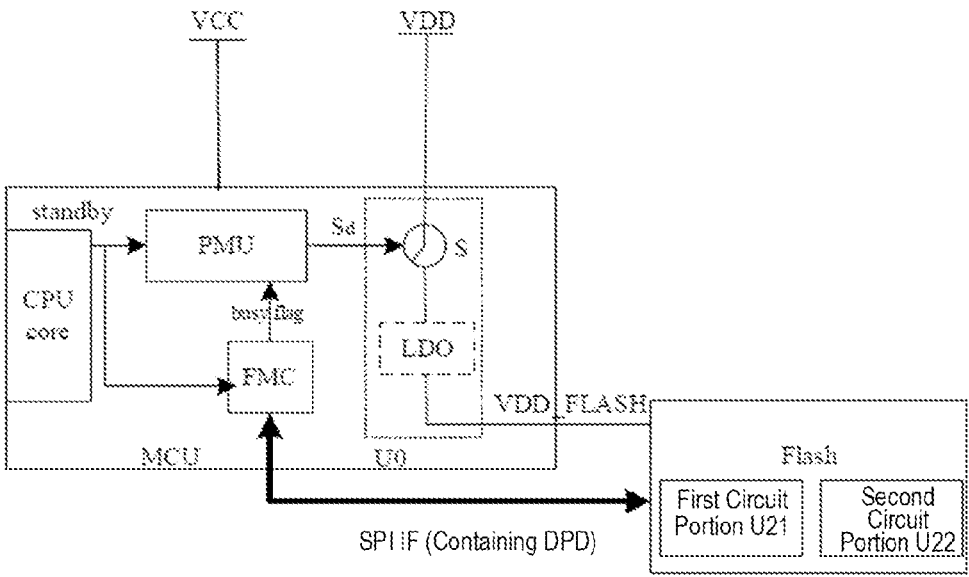
FIGS. 4A and 4B schematically illustrate various exemplary architectures of a system with an MCU and flash memory according to a second embodiment of the present invention.

As an example, with reference to FIG. 4A, the MCU and the flash memory may be implemented as two chips welded to a single PCB, with the power supply switching module U0 being integrated in the MCU chip.

Figure 4B:
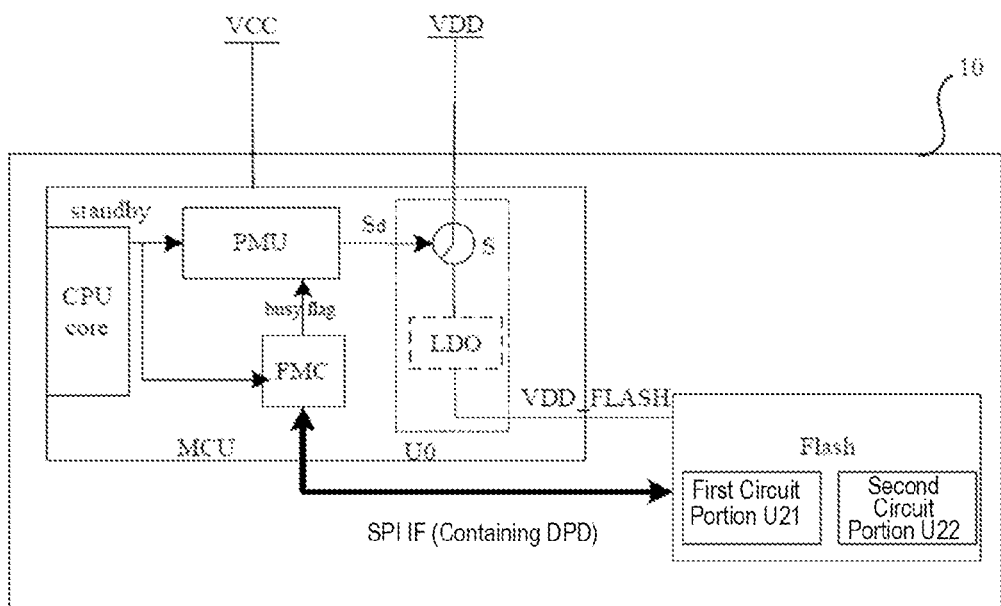

As another example, with reference to FIG. 4B, the MCU and the flash memory may be implemented as two dies integrated in a single package 10 using an SIP technique, with the power supply switching module U0 being integrated in the MCU die. The MCU and flash memory dies may be juxtaposed in the package 10. Alternatively, they may be three-dimensionally stacked using an advanced 2.5D/3D/wafer-level packaging technique.

The system and corresponding methods for DPD control thereof in Embodiment 2 are substantially the same as those in Embodiment 1 and, therefore, need not be described in further detail herein.

In the system and methods in Embodiment 2, the voltage conversion circuit LDO added between the power supply VDD and the power supply terminal of the flash memory enables them to be suitable for more product designs and a wider range of applications.

It would be appreciated that, in practice, the output terminal of the voltage conversion circuit LDO in Embodiment 2 may be directly packaged as the added power supply pin of the MCU chip in Embodiment 2 as compared to the existing MCU chip.

Embodiment 3

In some practical applications, there may be a risk of unauthorized external accesses for reading or tampering data stored in the flash memory. Accordingly, with reference to FIGS. 5A to 5D, in Embodiment 3 of the present invention, a system with an MCU and flash memory is provided, which differs from the system of Embodiment 2 by further including an unauthorized access monitoring module SS disposed in the MCU and coupled to a PMU in the MCU. In the event of a monitored unauthorized external accesses, the unauthorized access monitoring module SS may output a signal indicative of the unauthorized access (not shown) to the PMU, based on access signal, the PMU may cut power to a power supply terminal VDD_FLASH of the flash memory with a power supply control signal Sd (e.g., through activating the power supply control signal Sd), thereby providing protection over the flash memory.

The unauthorized access monitoring module SS may be implemented by any suitable electronic component or circuit design, which can provide any suitable monitoring mechanism against unauthorized external accesses by hardware, software or a combination thereof. For example, the unauthorized access monitoring module SS may include an overvoltage detection circuit, an under-voltage detection circuit, a temperature detection circuit (including a sensor), a clock glitch detection circuit and the like. The monitoring mechanism may include at least one of overvoltage protection, under-voltage protection, high temperature protection, low temperature protection, protection against MCU faults, protection against clock disturbances, address protection, various levels of read protection, etc.

Figure 5A:
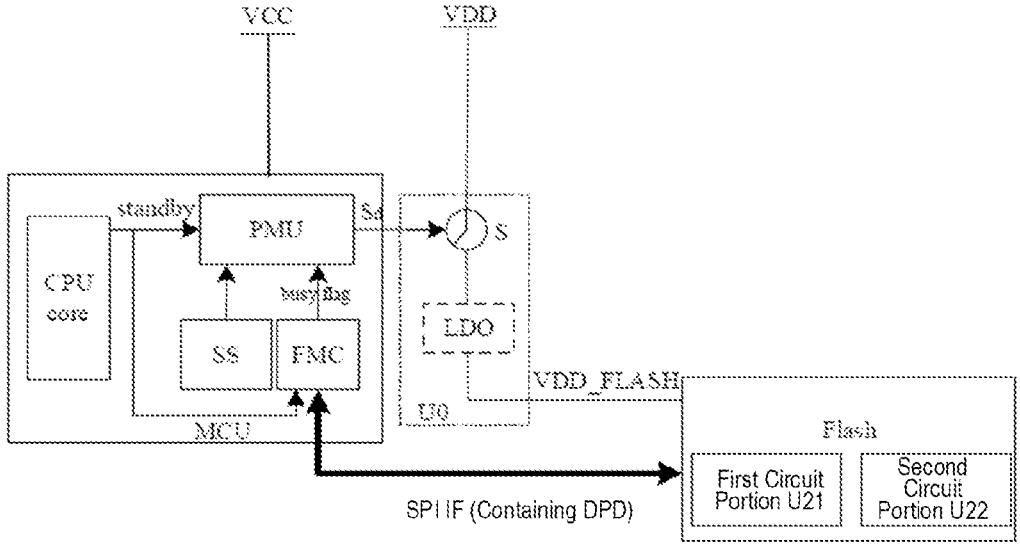
FIGS. 5A to 5D schematically illustrate various exemplary architectures of an SIP MCU system chip with an MCU and flash memory according to a third embodiment of the present invention.

As an example, with reference to FIG. 5A, a power supply switching module U0 may be implemented as a chip separate from the MCU chip. Moreover, the MCU, the power supply switching module U0 and the flash memory may be all implemented as chips welded to the same PCB. In this case, a power supply pin may be added to the MCU chip, as compared with the conventional MCU chip, and coupled to a power supply control signal Sd.

Figure 5B:
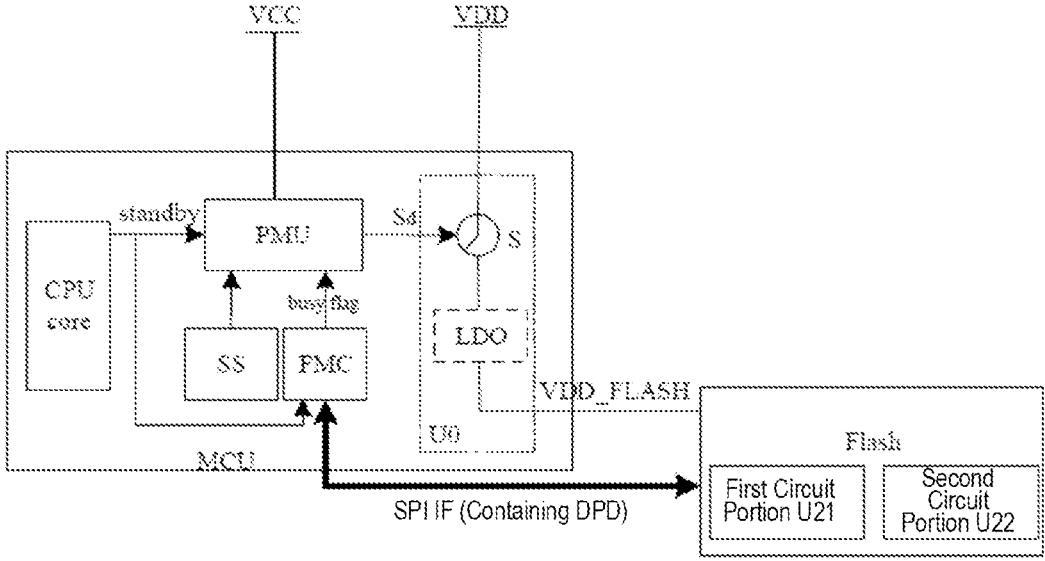

As another example, with reference to FIG. 5B, the power supply switching module U0 may be integrated in the MCU chip, along with a CPU core, the PMU, a FMC and the unauthorized access monitoring module SS, and the MCU and flash memory chips may be both welded to a single PCB. In this case, a power supply pin may be added to the MCU chip, as compared with the conventional MCU chip, as an output terminal of an LDO regulator that is coupled to the power supply terminal VDD_FLASH of the flash memory.

Figure 5C:
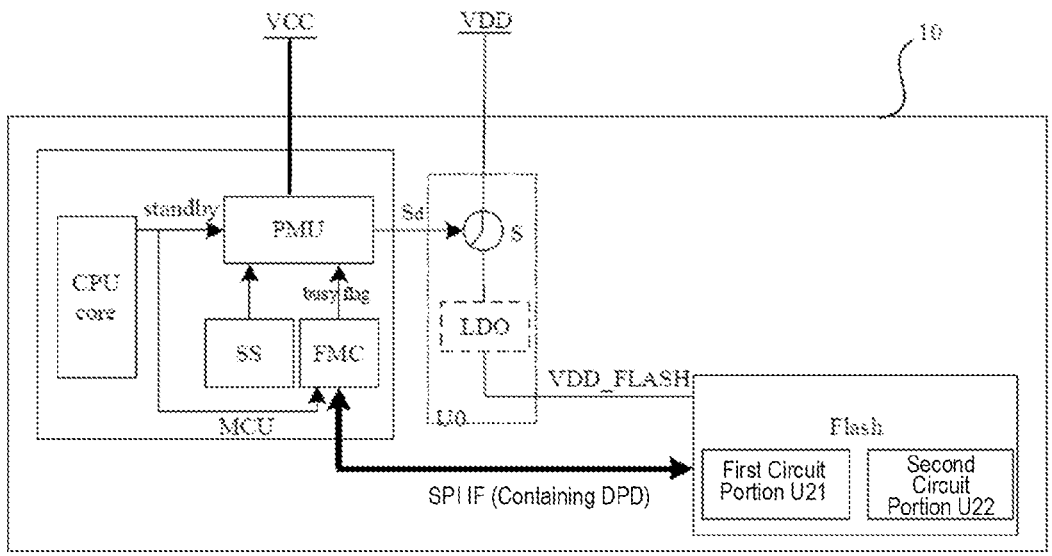

As another example, with reference to FIG. 5C, the MCU, the power supply switching module U0 and the flash memory may be implemented as dies, with the CPU core, the PMU, the FMC and the unauthorized access monitoring module SS integrated in the MCU die. The power supply switching module U0 die may be separate from the MCU die, and the MCU, power supply switching module U0 and flash memory dies may be integrated into a single package 10 using an SIP technique. The MCU, power supply switching module U0 and flash memory dies may be juxtaposed in the package 10. Alternatively, they may be three-dimensionally stacked using an advanced 2.5D/3D/wafer-level packaging technique.

Figure 5D:
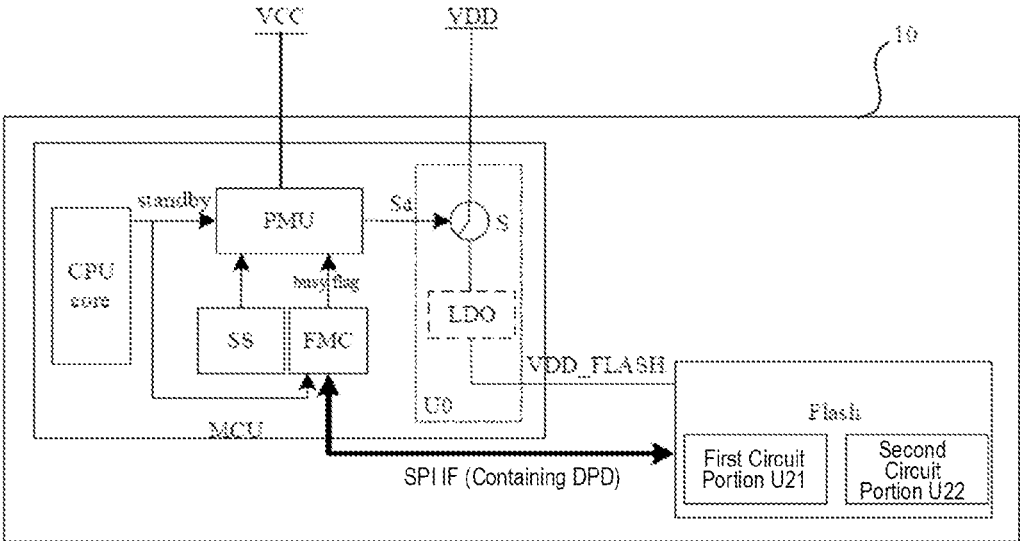

As another example, with reference to FIG. 5D, the MCU and the flash memory may be implemented as dies, with the power supply switching module U0 being integrated in the MCU die along with the CPU core, the PMU, the FMC and the unauthorized access monitoring module SS. The two dies may be integrated into a single package 10 using an SIP technique. The MCU and flash memory dies may be juxtaposed in the package 10. Alternatively, they may be three-dimensionally stacked using an advanced 2.5D/3D/wafer-level packaging technique. In this case, a power supply pin may be added to the MCU die, as compared with the conventional MCU die, as an output terminal of an LDO regulator (not shown) that is coupled to the power supply terminal VDD_FLASH of the flash memory.

Optionally, an access control bit (not shown) may be configured in the MCU. In this case, when the PMU receives from the unauthorized access monitoring module SS a signal indicating an access, if the access control bit is set (e.g., to "1"), the PMU may activate the power supply control signal Sd to cut power to the power supply terminal VDD_FLASH of the flash memory.

In an example of Embodiment 3, each of a DPD mode control bit and/or the access control bit may be configured in a configuration register (not shown) in the MCU. For example, the two bits may be configured in a single configuration register in the PMU. In another example of Embodiment 3, each of the DPD mode control bit and/or the access control bit may be configured in a separate configuration register in the PMU. The configuration register(s) may be defined by a user. When the system is required to enter a deep sleep mode by the user or by hardware, it may be caused to enter a first DPD mode, in which the flash memory is entirely powered down, resulting in even lower power consumption by setting the DPD mode control bit. Alternatively or additionally, when the system is required by the user or by hardware to detect possible accesses, it may be brought into the first DPD mode, in which the flash memory is entirely powered down, protecting data stored therein from being stolen by setting the access control bit. Apart from the configuration register(s), in other implementations, the system may be caused to enter the first DPD mode or a second DPD mode by sending different DPD mode signals to the PMU/FMC. For example, when a deep sleep instruction is received, if the CPU core in the MCU desires to enter the first DPD mode with even lower power consumption by powering down the flash memory, a first DPD mode signal Standby1 may be provided to the PMU/FMC. Otherwise, a second DPD mode signal Standby2 may be provided to the PMU/FMC.

The system and corresponding methods for DPD control thereof in Embodiment 3 are substantially the same as those in Embodiment 1 and, therefore, need not be described in further detail herein.

Figure 6:
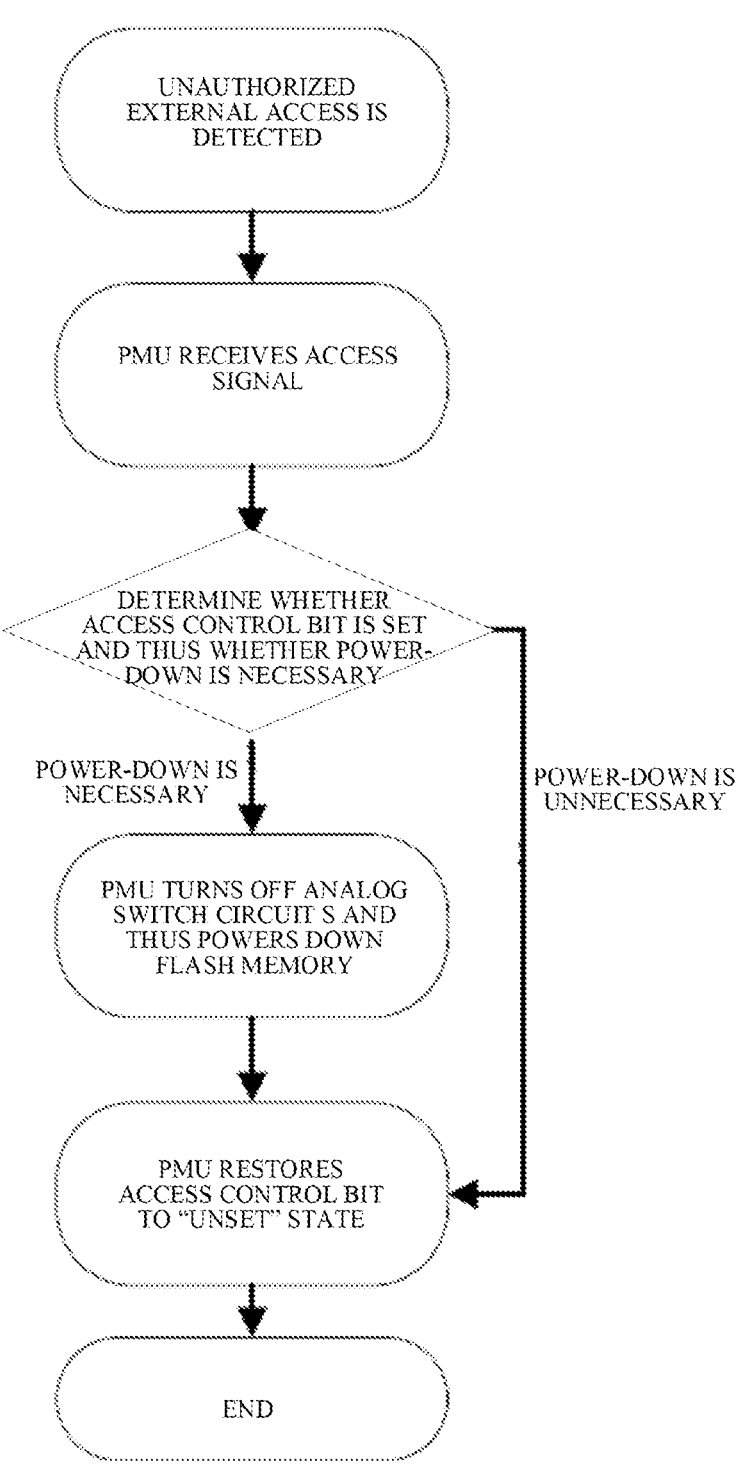
FIG. 6 shows an exemplary flowchart of a method for DPD control of the system according to the third embodiment of the present invention.

The system of Embodiment 3 further provides protection against unauthorized accesses. Specifically, with reference to FIG. 6, when the unauthorized access monitoring module SS detects an external access, it may pull up (or set) an access signal to the PMU. In some embodiment, the unauthorized access monitoring module SS may include a monitoring unit implemented by hardware and/or software (e.g., an overvoltage detection circuit, an under-voltage detection circuit, a temperature sensor, a clock glitch detection circuit or the like). When detecting an external access event (e.g., overvoltage, under-voltage, high temperature, low temperature, MCU fault, clock disturbance, abnormal address), it may pull up (or set) the access signal as a sign. The information (or meaning) of the access signal may be debounced and transmitted to the PMU. In response, the PMU may determine whether the user desires to power down the flash memory to protect sensitive information stored thereon, further based on information of the access control bit in the configuration register. If the determination is possible, then the access control bit may be set, and the PMU may activate the power supply control signal Sd (e.g., by pulling it up to a high level) to turn off an analog switch circuit S. Moreover, the access signal may be again unset to be prepared for the next external unauthorized access. If it is chosen not to power down the flash memory, as required by the operation or considering other factors (i.e., the access control bit in the configuration register is not set), the PMU may eliminate or deactivate the power supply control signal Sd to maintain the analog switch circuit S turned on. As a result, power is continuously supplied to the power supply terminal VDD_FLASH of the flash memory. In this case, the PMU may do nothing to the access signal, or restore it to the "unset" state.

Apparently, by additionally including the unauthorized access monitoring module SS, in the event of an unauthorized external access, the system in Embodiment 3 can power down the flash memory entirely in a timely manner to protect sensitive data therein from being stolen.

The system with an MCU and flash memory and the method for deep power down (DPD) control thereof provided by the embodiments of the present invention, which are compatible with the existing DPD mode and comprise a novel deeper power down mode, make the system and method suitable for use in some special applications requiring even lower power consumption.

Optionally, in a second DPD mode, the MCU may utilize the power supply control signal to enable power to be supplied to the power supply terminal of the flash memory, thereby allowing a normal operation of the first circuit portion while powering down the second circuit portion, and/or wherein the first circuit portion comprises a circuitry configured to restore the flash memory from the second DPD mode to the normal mode.

Optionally, the system may further comprise a power supply switching module, wherein an input terminal of the power supply switching module is coupled to a power supply required for the flash memory; an output terminal of the power supply switching module is coupled to the power supply pin; and a control terminal of the power supply switching module is coupled to the power supply control signal, wherein in the normal mode and the second DPD mode, the MCU utilizes the power supply control signal to maintain the power supply switching module turned on, enabling the power supply to supply power to the flash memory, and wherein in the first DPD mode, the MCU utilizes the power supply control signal to turn off the power supply switching module.

Optionally, the power supply switching module may comprise an analog switch circuit, wherein an input terminal of the analog switch circuit is coupled to the power supply; an output terminal of the analog switch circuit is coupled to the power supply pin; and a control terminal of the analog switch circuit is coupled to the power supply control signal.

Optionally, the power supply switching module may further comprise a voltage conversion circuit, wherein an input terminal of the voltage conversion circuit is coupled to the output terminal of the analog switch circuit; and an output terminal of the voltage conversion circuit is coupled to the power supply pin.

Optionally, the power supply switching module may be arranged outside the MCU, or integrated in the circuit of the analog domain of the MCU.

Optionally, the MCU may further comprise:

a flash memory controller communicatively connected to the flash memory through a communication bus interface, wherein the flash memory controller configured to send, through the communication bus interface, instructions for control of read, write and erase operations performed on the flash memory and instructions for control of an operating modes, and to detect a status of the flash memory when receiving a DPD mode signal; and a power management unit coupled to each of the flash memory controller and the power supply control signal, wherein when receiving the DPD mode signal, the power management unit is configured to utilize the power supply control signal to maintain or cut off power supplied to the power supply terminal of the flash memory, based on the DPD mode signal and the status detected by the flash memory controller.

Optionally, a DPD mode control bit may be configured in the MCU, wherein, when the DPD mode signal is not received by the power management unit, the system operates in the normal mode in which the power management unit utilizes the power supply control signal to maintain power supplied to the power supply terminal of the flash memory;

when the DPD mode signal is received by the power management unit and the DPD mode control bit is unset, the power management unit utilizes the power supply control signal to maintain power supplied to the power supply terminal of the flash memory, the flash memory controller sends a DPD mode instruction to the flash memory, and the flash memory enters the second DPD mode in response to the DPD mode instruction; and when the DPD mode signal is received by the power management unit and the DPD mode control bit is set, the power management unit utilizes the power supply control signal to cut off power to the power supply terminal of the flash memory, enabling the system to enter the first DPD mode.

Optionally, when the DPD mode signal is received by the power management unit and the DPD mode control bit is set, in case of detecting the flash memory being idle by the flash memory controller, the power management unit may utilize the power supply control signal to cut off power to the power supply terminal of the flash memory.

Optionally, the DPD mode control bit may be configured in a configuration register in the power management unit.

Optionally, the MCU may further comprise a processing core, wherein in case of receiving a deep sleep instruction, the processing core sends the DPD mode signal to each of the flash memory controller and the power management unit.

Optionally, the MCU may further comprise an unauthorized access monitoring module coupled to the power management unit, wherein in case of detecting an unauthorized external access, the unauthorized access monitoring module is configured to output an access signal to the power management unit, based on the access signal, the power management unit utilizes the power supply control signal to cut off power to the power supply terminal of the flash memory.

Optionally, an access control bit may be further configured in the MCU, wherein when the power management unit receives the access signal and the access control bit is set, the power management unit utilizes the power supply control signal to cut off power to the power supply terminal of the flash memory.

Optionally, the access control bit may be configured in a configuration register in the power management unit.

Optionally, the MCU and the flash memory may be integrated in a single package using an SIP technique.

Based on the same inventive concept, the present invention further provides a method for DPD control of a system with an MCU and flash memory, wherein the flash memory stores therein codes and/or sensitive data for the MCU and comprises a first circuit portion and a second circuit portion; the MCU comprises at least one power supply pin coupled to a power supply terminal of the flash memory; and the method comprises: when entry of the system into a deep sleep mode is required, the MCU utilizes a power supply control signal to cut off power to the power supply terminal of the flash memory, enabling the flash memory to enter a first DPD mode in which each of the first and second circuit portions is powered down.

Optionally, when entry of the system into the deep sleep mode is required and a DPD mode control bit in the MCU is set, the MCU may detect whether the flash memory is idle and wherein in case of detecting of the flash memory being idle, the MCU utilizes the power supply control signal to cut off power to the power supply terminal of the flash memory.

Optionally, the method may further comprise: when entry of the system into the deep sleep mode is required and a DPD mode control bit in the MCU is unset, maintaining power supplied to the power supply terminal of the flash memory and sending a DPD mode instruction from the MCU to the flash memory, wherein the flash memory enters a second DPD mode in response to the DPD mode instruction, in which the first circuit portion of the flash memory remains in operation while the second circuit portion of the flash memory is powered down.

Optionally, after the flash memory enters the first or second DPD mode, the MCU may power down its own associated circuitry, enabling the entire system into the deep sleep mode.

Optionally, the DPD mode control bit may be configured in a configuration register in a power management unit of the MCU.

Compared with the prior art, the embodiments of the present invention offer at least the following benefits:

1. Compared with the conventional system architecture, a new DPD mode (i.e., the first DPD mode) is provided by simply adding a power supply pin to the MCU, which is coupled to the power supply terminal of the flash memory. When entry of the system into a deep power down mode is required, the flash memory can be entirely powered down, leading to even lower system power consumption than in a conventional DPD mode (second DPD mode).

2. When the flash memory is idle, the system can enter into the DPD mode within a shorter time.

3. As it is compatible with the conventional deep sleep mode, it is suitable for use in both ordinary and special low system power consumption applications.

4. In the event of an unauthorized external access, the flash memory can also be entirely powered down to provide protection over sensitive information stored therein.

The foregoing description presents merely preferred embodiments of the present invention and is not intended to limit the scope of the present invention in any way. Any and all changes and modifications made by those of ordinary skill in the art in light of the above teachings without departing from the spirit of the present invention are intended to be within the scope as defined by the appended claims.

What is claimed is:

1. A system with a microcontroller unit (MCU) and a flash memory, wherein the flash memory is configured to store codes and/or data for the MCU and comprises a first circuit portion and a second circuit portion, and wherein the MCU comprises at least one power supply pin coupled to a power supply terminal of the flash memory, wherein, in a normal mode, the MCU is configured to utilize a power supply control signal to enable power to be supplied to the power supply terminal of the flash memory, thereby allowing a normal operation of each of the first and second circuit portions; and in a first deep power down (DPD) mode, the MCU is configured to utilize the power supply control signal to cut off power to the power supply terminal of the flash memory, thereby powering down each of the first and second circuit portions, wherein the MCU comprises a power supply switching module that is arranged outside the flash memory, wherein in the normal mode, the MCU is configured to utilize the power supply control signal to maintain the power supply switching module turned on, maintaining a power supply to supply power to the flash memory, and wherein in the first DPD mode, the MCU is configured to utilize the power supply control signal to turn off the power supply switching module, stopping the power supply to supply power to the flash memory, wherein the MCU further comprises a processing core, a flash memory controller and a power management unit, wherein the processing core is coupled to a first terminal of the flash memory controller and a first terminal of the power management unit, the flash memory controller is coupled to a second terminal of the power management unit and the flash memory, and a third terminal of the power management unit is coupled to the power supply switching module, and wherein an input terminal of the power supply switching module is coupled to a power supply required for the flash memory; an output terminal of the power supply switching module is coupled to the power supply pin of the MCU; and a control terminal of the power supply switching module is coupled to the third terminal of the power management unit.

2. The system of claim 1, wherein in a second DPD mode, the MCU is configured to utilize the power supply control signal to enable power to be supplied to the power supply terminal of the flash memory, thereby allowing a normal operation of the first circuit portion while powering down the second circuit portion, and/or wherein the first circuit portion comprises a circuitry configured to restore the flash memory from the second DPD mode to the normal mode.

3. The system of claim 2, wherein in the second DPD mode, the MCU is configured to utilize the power supply control signal to maintain the power supply switching module turned on, enabling the power supply to supply power to the flash memory.

4. The system of claim 3, wherein the power supply switching module is integrated in a circuit of an analog domain of the MCU.

5. The system of claim 2, wherein the flash memory controller is configured to send, through the communication bus interface, instructions for control of read, write and erase operations performed on the flash memory and instructions for control of operating modes, and to detect a status of the flash memory when receiving a DPD mode signal; and wherein when receiving the DPD mode signal, the power management unit is configured to utilize the power supply control signal to maintain or cut off power supplied to the power supply terminal of the flash memory, based on the DPD mode signal and the status detected by the flash memory controller.

6. The system of claim 5, wherein a DPD mode control bit is configured in the MCU, and wherein, when the DPD mode signal is not received by the power management unit, the system operates in the normal mode in which the power management unit is configured to utilize the power supply control signal to maintain power supplied to the power supply terminal of the flash memory;

when the DPD mode signal is received by the power management unit and the DPD mode control bit is unset, the power management unit is configured to utilize the power supply control signal to maintain power supplied to the power supply terminal of the flash memory, the flash memory controller sends a DPD mode instruction to the flash memory, and the flash memory enters the second DPD mode in response to the DPD mode instruction; and

when the DPD mode signal is received by the power management unit and the DPD mode control bit is set, the power management unit is configured to utilize the power supply control signal to cut off power to the power supply terminal of the flash memory, enabling the system to enter the first DPD mode.

7. The system of claim 6, wherein when the DPD mode signal is received by the power management unit and the DPD mode control bit is set, in case of detecting the flash memory being idle by the flash memory controller, the power management unit is configured to utilize the power supply control signal to cut off power to the power supply terminal of the flash memory.

8. The system of claim 6, wherein the DPD mode control bit is configured in a configuration register in the power management unit.

9. The system of claim 5, wherein in case of receiving a deep sleep instruction, the processing core sends the DPD mode signal to each of the flash memory controller and the power management unit.

10. The system of claim 5, wherein the MCU further comprises an unauthorized access monitoring module coupled to the power management unit, wherein in case of detecting an unauthorized external access, the unauthorized access monitoring module is configured to output an access signal to the power management unit, and based on the access signal, the power management unit is configured to utilize the power supply control signal to cut off power to the power supply terminal of the flash memory.

11. The system of claim 10, wherein an access control bit is further configured in the MCU, and wherein when the power management unit receives the access signal and the access control bit is set, the power management unit is configured to utilize the power supply control signal to cut off power to the power supply terminal of the flash memory.

12. The system of claim 11, wherein the access control bit is configured in a configuration register in the power management unit.

13. The system of claim 1, wherein the MCU and the flash memory are integrated in a single package using a system-in-package (SIP) technique.

14. The system of claim 1, wherein the power supply switching module comprises an analog switch circuit, wherein an input terminal of the analog switch circuit is coupled to the power supply; an output terminal of the analog switch circuit is coupled to the power supply pin; and a control terminal of the analog switch circuit is coupled to the power supply control signal.

15. The system of claim 14, wherein the power supply switching module further comprises a voltage conversion circuit, wherein an input terminal of the voltage conversion circuit is coupled to the output terminal of the analog switch circuit; and an output terminal of voltage conversion circuit is coupled to the power supply pin.

16. A method for deep power down (DPD) control of a system with a microcontroller unit (MCU) and a flash memory, wherein the flash memory is configured to store codes and/or data for the MCU and comprises a first circuit portion and a second circuit portion; the MCU comprises at least one power supply pin coupled to a power supply terminal of the flash memory; and the method comprises:

when entry of the system into a deep sleep mode is required, the MCU is configured to utilize a power supply control signal to cut off power to the power supply terminal of the flash memory, enabling the flash memory to enter a first DPD mode in which each of the first and second circuit portions is powered down, wherein the MCU comprises a power supply switching module that is arranged outside the flash memory, wherein in a normal mode, the MCU is configured to utilize the power supply control signal to maintain the power supply switching module turned on, thereby maintaining a power supply to supply power to the flash memory, and wherein in the first DPD mode, the MCU is configured to utilize the power supply control signal to turn off the power supply switching module, thereby stopping the power supply to supply power to the flash memory, wherein the MCU further comprises a processing core, a flash memory controller and a power management unit, wherein the processing core is coupled to a first terminal of the flash memory controller and a first terminal of the power management unit, the flash memory controller is coupled to a second terminal of the power management unit and the flash memory, and a third terminal of the power management unit is coupled to the power supply switching module, and wherein an input terminal of the power supply switching module is coupled to a power supply required for the flash memory; an output terminal of the power supply switching module is coupled to the power supply pin of the MCU; and a control terminal of the power supply switching module is coupled to the third terminal of the power management unit.

17. The method of claim 16, wherein when entry of the system into the deep sleep mode is required and a DPD mode control bit in the MCU is set, the MCU detects whether the flash memory is idle, and wherein in case of detecting of the flash memory being idle, the MCU is configured to utilize the power supply control signal to cut off power to the power supply terminal of the flash memory.

18. The method of claim 16, further comprising: when entry of the system into the deep sleep mode is required and a DPD mode control bit in the MCU is unset, maintaining power supplied to the power supply terminal of the flash memory and sending a DPD mode instruction from the MCU to the flash memory, wherein the flash memory enters a second DPD mode in response to the DPD mode instruction, in which the first circuit portion of the flash memory remains in operation while the second circuit portion of the flash memory is powered down.

19. The method of claim 18, wherein after the flash memory enters the first DPD mode or the second DPD mode, associated circuits of the MCU are powered down, enabling the system to enter the deep sleep mode.

20. The method of claim 17, wherein the DPD mode control bit is configured in a configuration register in a power management unit of the MCU.

* * * * *